United States Patent [19]

Williams

[11] 3,963,316

[45] June 15, 1976

[54] ELECTRICAL CONNECTOR FOR A PRINTED CIRCUIT BOARD

[75] Inventor: Benjamin Charles Williams, Harrisburg, Pa.

[73] Assignee: AMP Incorporated, Harrisburg, Pa.

[22] Filed: Nov. 1, 1973

[21] Appl. No.: 411,936

Related U.S. Application Data

[63] Continuation-in-part of Ser. No. 298,995, Oct. 19, 1972, abandoned.

[52] U.S. Cl. .......................... 339/17 C; 339/217 R

[51] Int. Cl.$^2$ .......................................... H05K 1/02

[58] Field of Search ................ 174/68.5; 317/101 C, 317/101 CC, 101 D, 101 DH; 339/17, 18, 19, 217, 219, 220, 275, 276, 176 MP, 119, 120, 125, 128, 91

[56] References Cited

UNITED STATES PATENTS

| | | | |
|---|---|---|---|
| 2,825,036 | 2/1958 | Sorensen | 339/17 R |
| 2,857,582 | 10/1958 | Wintress | 339/275 B X |
| 3,008,119 | 11/1961 | Swengel | 339/17 R X |
| 3,027,537 | 3/1962 | Hess et al. | 339/217 S |
| 3,047,831 | 7/1962 | Majewski | 339/217 S |
| 3,096,393 | 7/1963 | Mancini | 339/17 R X |
| 3,107,965 | 10/1963 | Solorow et al. | 339/17 R X |
| 3,344,388 | 9/1967 | Parker et al. | 339/217 S |
| 3,808,588 | 4/1974 | McGregor | 339/217 S |

FOREIGN PATENTS OR APPLICATIONS

| | | | |
|---|---|---|---|
| 1,489,298 | 6/1967 | France | 339/217 S |

*Primary Examiner*—Roy D. Frazier
*Assistant Examiner*—Terrell P. Lewis
*Attorney, Agent, or Firm*—William J. Keating; Donald W. Phillion

[57] ABSTRACT

An electrical connector is attachable to an insulated electrical conductor wire and insertable partially through a hole defined through a printed circuit board after attachment of the connector to the wire in order to retain a bared end portion of the wire in a desired predetermined position between the sidewalls of the hole and substantially below the top surface of the board prior to the formation of an electrical solder connection between the bared end portion of the wire and an electrical conductor formed on the bottom surface of the board. The connector is comprised by a base having rearward and forward portions, a first pair of sidewalls extending outwardly from opposed longitudinal sides of the rearward base portion, a second pair of sidewalls extending outwardly from opposed longitudinal sides of the forward base portion, and a pair of resiliently flexible hook-like members projecting from the second pair of sidewalls. The first sidewalls and the rearward base portion are together capable of being formed in a first predetermined configuration about an insulated marginal end portion of the wire adjacent to the bared end portion to mechanically grip the insulated marginal end portion, the first predetermined configuration having a maximum lateral dimension slightly larger than a maximum lateral dimension of the hole. The second sidewalls and the forward base portion are together capable of being formed in a second predetermined configuration about the bared end portion of the wire, the second predetermined configuration having lateral dimensions slightly smaller than, and alignable within, the lateral dimensions of the hole and a longitudinal dimension which at a maximum is substantially equal to the depth of the hole. Each of the pair of hook-like members have first and second segments. Each of the first segments is connected at one of its two ends to one of the second sidewalls and projects forwardly therefrom within the lateral dimensions of the second sidewalls. Each of the second segments merges at one of its two ends from one of the other ends of the first segments and projects rearwardly therefrom. Each of the other ends of the second segments is disposed outwardly from one of the one ends of the first segments and outside of the lateral dimensions of the hole and is displaced longitudinally along the connector from one of the first sidewalls through a distance slightly greater than the thickness of the board. At least one of the first and second segments is flexibly moveable so as to dispose the other end of the second segment within the lateral dimensions of the hole.

Alternatively, in lieu of hook-like members a channel-shape or semi-cylindrical portion can be secured to said forward base portion and extend through said hole. The wire is also extended through said hole and retained in said channel-shaped portion. A finger-like element is formed from, and secured at one end to, said channel-shaped section with its other end which is free extending outwardly from said channel-shaped section and up towards said circuit board to abut thereagainst.

7 Claims, 15 Drawing Figures

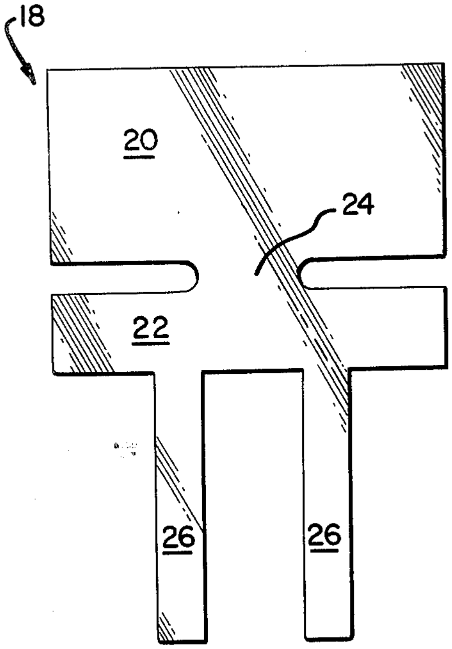
Fig. 10
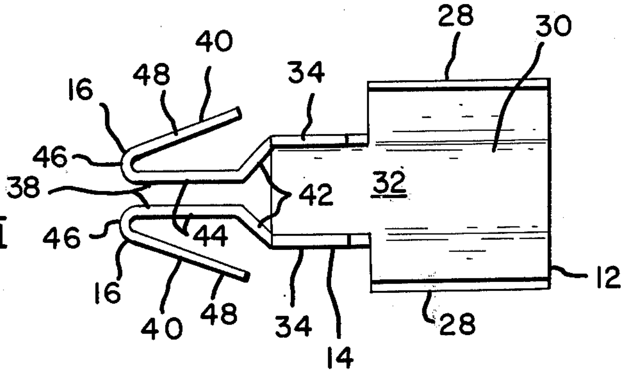
Fig. 11
Fig. 12
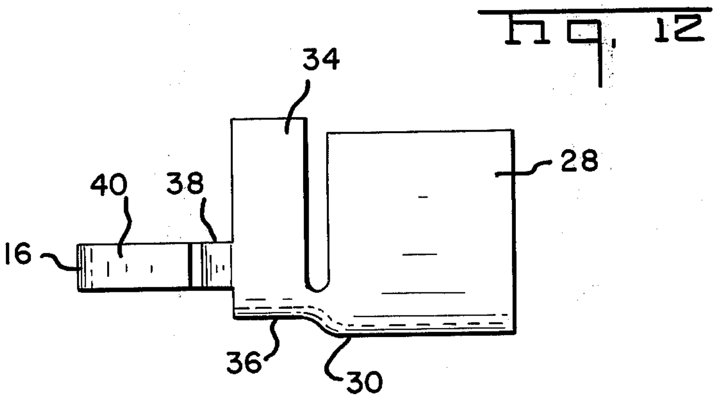

ELECTRICAL CONNECTOR FOR A PRINTED CIRCUIT BOARD

This application is a continuation-in-part of my previous application Ser. No. 298,995, now abandoned filed Oct. 19, 1972.

BACKGROUND OF THE INVENTION

1. Field of the Invention

The present invention broadly relates to an electrical connector attachable to an electrical conductor wire at a conductive end portion of the wire and insertable partially through a hole defined through a board after attachment of the connector to the wire and more particularly is concerned with an electrical connector attachable to an insulated electrical conductor wire, the wire having both a bared conductive end portion and an insulated marginal end portion adjacent to the bared end portion, the connector being insertable partially through a hole defined through a printed circuit board after attachment of the connector to the wire for retaining the bared end portion of the wire in a desired predetermined position between the sidewalls of the hole and substantially below the top surface of the board prior to the formation of an electrical solder connection between the bared end porof the wire and an electrical conductor formed on the bottom surface of the board.

2. Description Of The Prior Art

It is common practice, in the art of manufacturing printed circuit boards, to provide holes in the boards for the reception of electrical conductor wires or electrical connectors attached to conductor wires leading from other electrical components which are desired to be electrically connected to conductors formed on the board. The conductor wires or the connectors attached thereto are then soldered to the conductors on the underside of the board to form the electrical connections between the conductors and the wires.

Various means for retaining the conductor wire within or adjacent to the hole formed through a printed circuit board are known in the prior art.

One commonly used means is a metallic liner which is inserted into the hole and has the capability of retaining the conductor wire therein, for example, the liner described and illustrated in U.S. Pat. No. 3,548,369 which is assigned to AMP Incorporated of Harrisburg, Pennsylvania.

Another commonly used means is an electrical connector attachable to the conductor wire prior to its insertion into the printed circuit board hole which is manufactured and sold by AMP Incorporated under the trademark AMP-IN. This connector is described and illustrated in a publication entitled "AMP-IN* and AMP-EDGE* TERMINALS FOR PRINTED CIRCUIT APPLICATIONS" and designated as Folder 938, Revised 8–67, the disclosure of which is incorporated herein by reference thereto. A disadvantage of the AMP-IN connector in certain applications is that when the connector is inserted into the printed circuit board hole, the end of the conductor wire is disposed by the connector at a position spaced above the top surface of the board. Thus, only an indirect electrical connection between the end of the conductor wire and the conductor on the bottom surface of the board is possible by soldering together the conductor on the board and the pin tip portion of the connector which projects below the top surface of the board. Furthermore, the substantial height of this connector above the top surface of the board is undesirable in certain applications where available space is limited such as where several boards are to be disposed in side-by-side parallel relationships and as close to each other as is possible.

A further commonly used means is another electrical connector also attachable to the conductor wire prior to its insertion into printed circuit board hole which is manufactured and sold by AMP Incorporated under the trademark CIRCUITIP. This connector is described and illustrated in a publication entitled "AMP CIRCUITIP* TERMINALS" and designated as Folder No. 475, Reprinted 12–68, the disclosure of which is incorporated herein by reference thereto. This electrical connector is also described and illustrated in U.S. Pat. Nos. 3,076,164 and 3,230,612 assigned to AMP Incorporated. While the CIRCUITIP connector does overcome the disadvantages referred to above in regard to the AMP-IN connector, both of these connectors have retention features which do not fully insure against accidental dislodgment of the connector from the hole prior to the soldering operation.

OBJECTS AND SUMMARY OF THE INVENTION

The electrical connector of the present invention substantially overcomes all of the aforementioned disadvantages of the above referred to connectors.

An object of the invention, therefore, is to provide an electrical connector which is capable of attachment to an electrical conductor wire, capable of insertion partially through a hole defined through a board after attachment of the connector to the wire, and capable of retaining the wire between the sidewalls of the hole, after its partial insertion therethrough, in such manner so as to substantially insure against accidental dislodgement of the connector from the hole.

Another object of the invention is to provide an electrical connector which is capable of attachment to an electrical conductor wire at a conductive end portion of the wire, capable of insertion partially through a hole defined through a board after attachment of the connector to the end portion of the wire, and capable of insuring retention the end portion of the wire in a desired predetermined position between the sidewalls of the hole and substantially below the top surface of the board prior to the formation of an electrical connection between the end portion of the wire and an electrical conductor disposed adjacent to the hole and the bottom surface of the board after partial insertion of the connector through the hole.

A further object of the invention is to provide an electrical connector which is capable of attachment to an insulated electrical conductor wire having both a bared conductive end portion and an insulated marginal end portion adjacent to the bared end portion, capable of insertion partially through a hole defined through a printed circuit board after attachment of the connector to the wire at least at one of the bared end portion and the insulated end portion of the wire, and capable of insuring retention the bared end portion of the wire in a desired predetermined position between the sidewalls of the hole and substantially below the top surface of the board prior to the formation of an electrical solder connection between the bared end portion of the wire and an electrical conductor formed on the bottom surface of the board.

These and other objects of the invention are achieved in a preferred embodiment thereof wherein an electrical connector is provided having stop means capable of being formed in a first predetermined configuration in which configuration a portion of the stop means is disposed in a position which is aligned outside of the lateral dimensions of the hole, wire receiving means connected end-to-end with the stop means and capable of being formed in a second predetermined configuration at least partially about the wire to mechanically grip the wire, the second configuration having lateral dimensions slightly smaller than, and alignable within, the lateral dimensions of the hole, and at least one resiliently flexible hook-like member, the member having first and second segments, the first segment connected at one of its two ends to the wire receiving means and projecting forwardly therefrom within the lateral dimensions of the wire receiving means, the second segment merging at one of its two ends from the other end of the first segment and projecting rearwardly therefrom, the other end of the second segment being disposed adjacent to the wire receiving means and outside of the lateral dimensions of the wire receiving means and the hole and being displaced longitudinally along the connector from the stop means through a distance slightly greater than the thickness of the board. At least one of the first and second segments is flexibly moveable so as to dispose the other end of the second segment within the lateral dimensions of the hole. The stop means of the connector may be comprised by an insulation receiving means capable of being formed at least partially about the insulated marginal end portion of the wire. In accordance with another form of the invention there is provided, in lieu of the hook-like members, a channel-shaped or semi-cylindrical-shaped portion secured to the wire receiving means and positioned completely through the hole on that side of the circuit board opposite the stop means and constructed to retain the end of said wire which also extends completely through the hole in the circuit board. A finger-like or prong-shaped element is formed from the channel-shaped portion with one end of said finger-like element remaining integrally attached to the channel-shaped element and the other end extending outwardly from the convex side of the channel-shaped element and up towards the circuit board surface and terminating on a conductive pad formed on said surface. Thus, said finger-like element not only provides a means for retaining the contact securely within said hole in cooperation with said stop means, but also provides an electrical connection directly to a conductive pad on said circuit board surface which will form a basis for adherence of solder when wave soldering of the assembly is done.

Other objects and attainments of the invention will become apparent to those skilled in the art upon a reading of the following detailed description when taken in conjunction with the drawings in which there is shown and described an illustrative embodiment of the invention; it is to be understood, however, that this embodiment is not intended to be exhaustive nor limiting of the invention but is given for purpose of illustration in order that others skilled in the art may fully understand the invention and the principles thereof and the manner of applying it in practical use so that they may modify it in various forms, each as may be best suited to the conditions of a particular use.

BRIEF DESCRIPTION OF THE DRAWINGS

In the course of the following detailed description reference will be frequently made to the attached drawings in which:

FIG. 1 is a side elevational view of the prior art electrical connector which is manufactured and sold by AMP Incorporated under the trademark AMP-IN;

FIG. 10 is a plan view of a stamped out sheet metal blank from which is formed the connector shown in FIG. 1;

FIG. 11 is a top plan view of the connector shown in FIG. 1; and

FIG. 12 is a side elevational view of the connector shown in FIG. 1.

DETAILED DESCRIPTION OF THE PREFERRED EMBODIMENT

Figure 1:
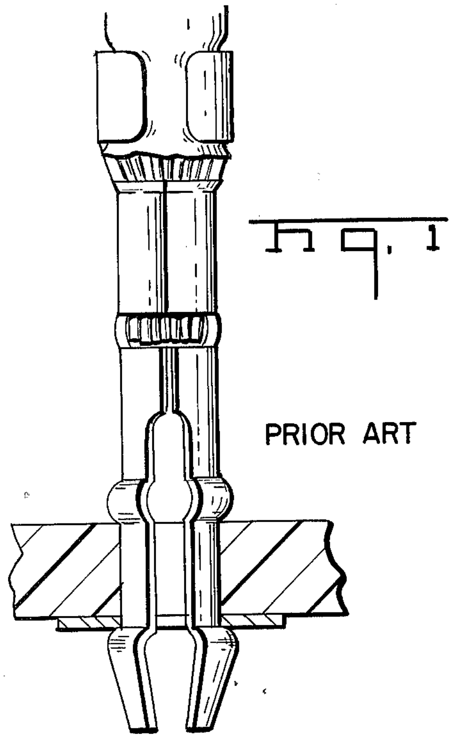
Figure 3:
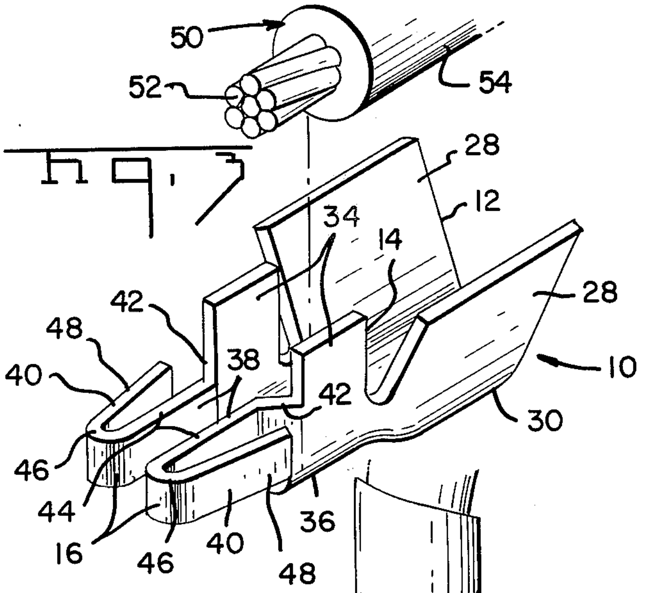
FIG. 3 is a perspective view of the electrical connector embodying the principles of the present invention in its form prior to its attachment to a conductor wire.
Figure 2:
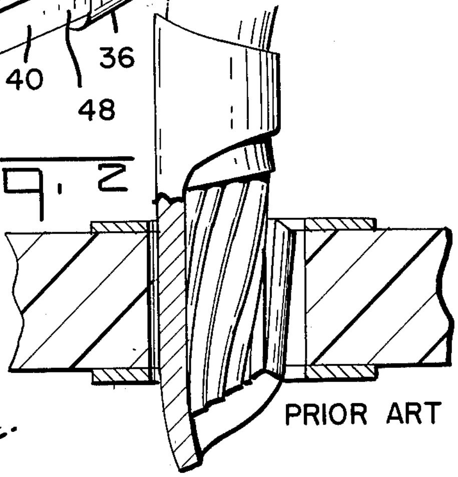
FIG. 2 is a side elevational view in partial sectional form of the prior art electrical connector which is manufactured and sold by AMP Incorporated under the trademark CIRCUITIP.

Referring now in greater detail to the various figures of the drawings wherein like reference characters refer to like parts, there is shown at 10 in FIG. 3 an electrical connector forming the preferred embodiment of the present invention. The connector 10 is comprised by an insulation receiving portion 12, a bared wire receiving portion 14 connected end-to-end with the insulation receiving portion 12, and a pair of resiliently flexible hook-like members 16 which are each connected to, and project downwardly from the bared wire receiving portion 14.

A blank 18 from which the connector 10 is formed is illustrated in FIG. 10. The blank 18 may be stamped out from any suitable sheet of metal, such as brass plated with pre-tin lead. The blank 18 has a planar rear portion 20, and a planar forward portion 22 which is connected to the rearward portion 20 at web portion 24. The blank 18 further includes a pair of planar strips 26 which extend from a forward edge of the forward portion 22 and are aligned substantially parallel to each other. By the utilization of conventional forming dies, the rear and forward portions 20, 22 and strips 26 of the blank 18 are bent to the shape as shown in FIGS. 3, 11 and 12 to thereby form the connector 10. In particular, the rearward portion 20 of the blank 18 is bent so as to form a first pair of sidewalls 28 which extend outwardly in a diverging fashion form opposed longitudinal sides of a rear portion 30 of an arcuate-shaped base 32 of the connector 10. The forward portion 22 of the blank 18 is bent so as to form a second pair of sidewalls 34 which extend in a substantially parallel fashion with respect to each other from opposed longitudinal sides of a forward portion 36 of the base 30 of the connector 10. The two strips 26 of the blank 18 are bent so as to form the pair of hook-like members 16. Therefore, the insulation receiving portion 12 of the connector 10 is comprised by the first pair of sidewalls 28 and the rearward base portion 30, and the bared wire receiving portion 14 of the connector 10 is comprised by the second pair of sidewalls 34 and the forward base portion 36. Further, the insulation receiving portion 12 may also function as a stop as will be explained hereinafter.

As clearly shown in FIGS. 3 and 11, each of the hook-like members 16 has first and second segments 38, 40. The first segment 38 is connected at one of its two ends to the forward edge of one of the second sidewalls 34 and projects forwardly therefrom within the lateral dimensions of the bared wire receiving portion 14 as defined by the spaced apart sidewalls 34. The first segment 38 of each member 16 has a first rearward portion 42 which projects inwardly and forwardly from one of the sidewalls 34, and a first forward portion 44 which merges from the first rearward portion 42 and projects substantially forwardly from the first rearward portion 42. The second segment 40 merges at one of its two ends from the other end of the first segment 38 and projects rearwardly therefrom. The second segment 40 of each member 16 has a second forward portion 46 which merges from the first forward portion 44 of the first segment 38 and projects first forwardly, then outwardly, and finally rearwardly in an overall arcuate manner from the first forward portion 44 of the first segment 38. The second segment 40 also has a second rearward portion 48 which merges from the second forward portion 46 of the second segment 40 and projects outwardly and rearwardly from the second forward portion 46. The other end of the second segment 40 on the second rearward portion 48 of the segment 40, that being a free end 45 of each member 16, is thereby disposed outwardly from the one end of the first segment 38 and outside of the lateral dimensions of the bared wire receiving portion 14 of the connector 10.

There is also illustrated in FIG. 3 an insulated electricl conductor wire 50 having a conductive bared end portion 52 aligned with the bared end receiving portion 14 of the connector 10, and insulated marginal end portion 54 aligned with the insulation receiving portion 12 of the connector 10. The conductive portion of the conductor wire 50 illustrated is a stranded conductor wire, however, the conductive portion of the wire 50 may be a solid conductor wire.

Figure 4:
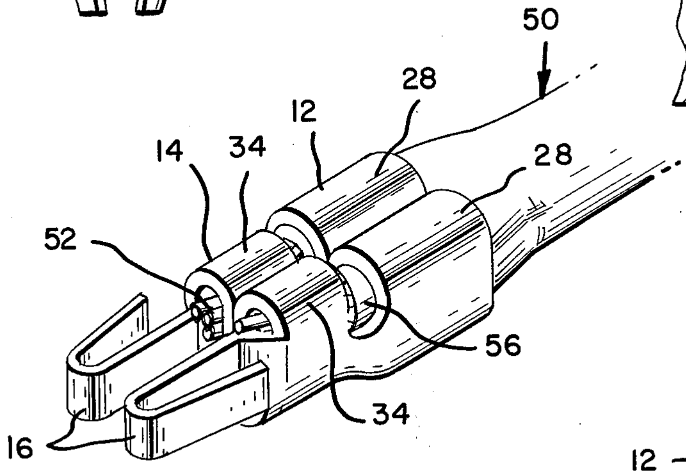
FIG. 4 is a perspective view of the electrical connector of FIG. 3 after it has been attached to the conductor wire.

After the conductor wire 50 is disposed with its bared end portion 52 between second sidewalls 34 of the connector 10 and its insulated marginal end portion 56 between first sidewalls 28 of the connector 10, the sidewalls 28, 34 of the connector 10 are bent respectively toward each other through arcuate-shaped converging paths in a known manner by conventional crimping dies to thereby attach the connector 10 to the conductor wire 50 as shown in FIG. 4.

The first pair of sidewalls 28 and the rearward base portion 30 which together comprise the insulation receiving portion 12 of the preferred embodiment of the connector 10 are formed in a first predetermined configuration such as that shown in FIGS. 4 through 7. The first configuration of the insulation receiving portion 12 has a maximum lateral dimension which is slightly larger than a maximum lateral dimension of a hole 58 defined in a board 60, such as a printed circuit board 60 shown in FIGS. 5 through 9. For example, the maximum distance through the cross-section of the insulation receiving portion 12 and between the outermost portions of the sidewalls 28 of the portion 12 when the connector 10 is attached to the insulated marginal end portion 54 of the wire 50 is slightly larger than the maximum distance between opposing portions of the sidewall 62 of the circular hole 58 defined through the board 60 that being the diameter of the hole 58.

The first sidewalls 28 of the insulation receiving portion 12, if desired, may be formed to entirely encompass the insulated marginal end portion 56 of the wire 50 as shown in FIG. 4 and to mechanically grip the marginal end portion 56. Alternatively, the sidewalls 28 may be formed only partially about the marginal end portion 56 and still perform their mechanical gripping function on the marginal end portion 56. However, it is not essential that the sidewalls 28 mechanically grip the end portion 56 if support for the insulated end portion 56 is not desired. In order for the insulation receiving portion 12 of the connector 10 to merely serve as a stop means for the connector 10, the first sidewalls 28 need only be formed in a first predetermined configuration in which a portion of at least one of the first sidewalls 28 extends, and is aligned, outside of the lateral dimensions of the hole 58 of the board 60 when the connector 10 has been inserted partially through the hole 58 in order to prevent the connector 10 from dropping completely through the hole 58. For instance, if the wire 50 were a completely bared Wire, it may be desired only to utilize the first sidewalls 28 as stop means and not additionally as means for supporting the wire 50. For that matter, even if the wire 50 is insulated, the first sidewalls 28 may still be desired to only serve the purpose of stop means for the connector 10.

The second pair of sidewalls 34 and the forward base portion 36 which together comprise the bared wire receiving portion 14 of the preferred embodiment of the connector 10 are formed in a second predetermined configuration such as that shown in FIGS. 4 through 9. The second configuration has lateral dimensions which are slightly smaller than, and alignable within, the lateral dimensions of the hole 60. For example, the maximum distance through the cross-section of the bared wire receiving portion 14 and between the outermost portions of the sidewalls 34 of the portion 14 when the connector 10 is attached to the bared end portion 52 of the wire is slightly smaller than the maximum distance between opposing portions of the sidewall 62 of the circular hole 58 defined through the board 60 that being the diameter of the hole 58. Also, in the preferred embodiment of the connector 10, the longitudinal dimension of the bared wire receiving portion 14 is at a maximum substantially equal to the depth of the hole 58.

Figure 6:
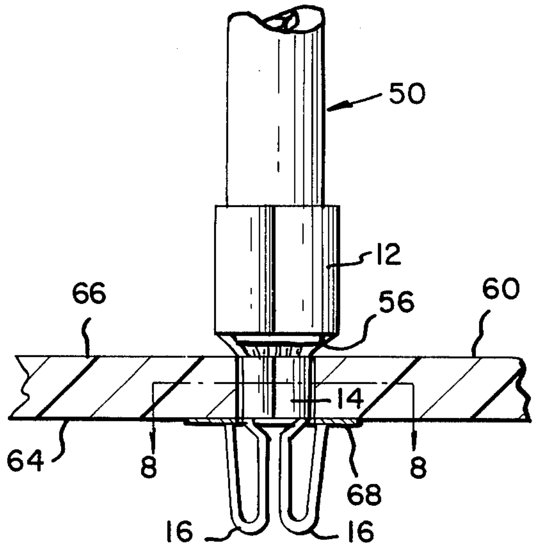
FIG. 6 is a side elevational view of the connector after its insertion partially through the hole of the printed circuit board but prior to the formation of the electrical solder connection between the conductor wire and a conductor formed on the bottom surface of the printed circuit board.

Both before and after insertion of the connector 10 partially through the hole 58 as respectively shown in FIGS. 4 and 6, the hook-like members 16 are disposed in an unflexed condition wherein the other ends of the second segments 40, which are the free ends 45 of the members 16, are displaced from each other through a distance greater than the maximum lateral dimension of the hole 58 (that being the diameter of the circular hole 58) as well as being displaced from each other outside of the lateral dimensions of the bared wire receiving portion 14. Therefore, in the unflexed condition of the members 16, the free ends 45 are disposed outside of the lateral dimensions of the hole 58, as is readily apparent in FIG. 6 which illustrates the connector 10 attached to the wire 50 and partially inserted through the hole 58 in its desired operative position.

Although the connector 10 forming the preferred embodiment of the invention has a pair of the hook-like members 16, one of the members 16 could be omitted without sacrificing any of the advantages of the invention. Further, the single member 16 may be connected to the forward edge of the forward base portion 36 instead of the forward edge of one of the second siewalls 34 of the bared wire receiving portion 14. The use of the pair of members 16 is preferred in that they more readily facilitate alignment of the bared wire receiving portion 14 of the connector 10 with the hole 58 during insertion of the connector 10 into the hole 58.

Figure 5:
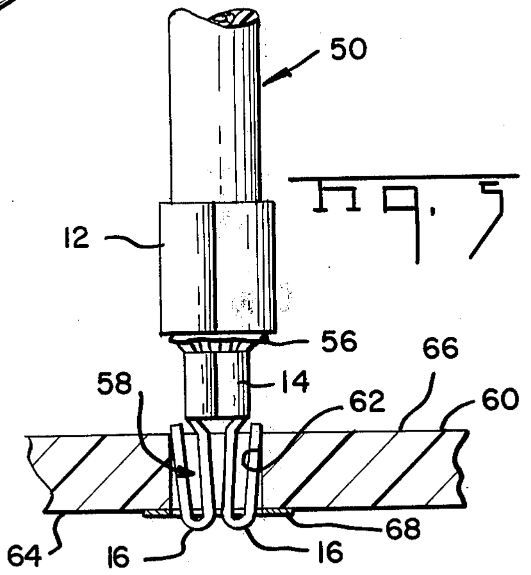
FIG. 5 is a side elevational view of the connector attached to the wire and aligned within a hole defined through a printed circuit board during insertion of the connector partially through the hole.

In the unflexed condition of members 16, and in a flexed condition of the members 16 as shown in FIG. 5, the free ends 45 of the members 16 are displaced longitudinally along the connector 10 from the first sidewalls 28 of the insulation receiving portion 12 through a distance slightly greater than the thickness of the board 60.

The connector 10 after attachment to the wire 50 is inserted partially through the hole 58 of the board 60 as follows. Each of the hook-like members 16 of the connector 10 at the second forward portion 46 of the second segment 40 of each of the members 16 is brought into contact with a top edge portion of the hole 58. Movement of the connector 10 toward the hole 58 causes the first segments 38 of the members 16 to flex about their connections with the second sidewalls 34 and move toward each other to their respective positions shown in FIG. 5. Further, simultaneously therewith, the second segments 40 of the members 16 flex about their connections with the first segments 38 and relative to the first segments 38 and thereby move toward each other in the same direction as the corresponding one of the first segments to respective positions inside of the lateral dimensions between opposing sidewall portions of the hole 58, as shown in FIG. 5. However, flexible movement of only one of the first and second segments 38, 40 may be provided which would also dispose the free ends 45 of the members 16 inside of the lateral dimensions of the hole 58.

After continued movement of the connector 10 through the hole 58 to a position where the members 16 have passed completely through the hole 58, the inherent resiliency of the members 16 causes the members 16 to return to their unflexed condition as shown in FIG. 6 in which the free ends 45 of the members 16 are again disposed outside of the lateral dimensions of the hole 58 and adjacent to the bottom surface 64 of the board 60. Because the displacement between the free ends 45 of the members 16 and the forward edge of the insulation receiving portion 12 is only slightly greater than the thickness of the board 60 such that the free ends 45 of the members 16 are disposed against the bottom surface 64 of the board 60 and the insulation receiving portion 12 acting as stop means is disposed against the top surface 66 of the board 60, the connector 10 is now retained in a desired predetermined position partially through the hole 58. The members 16 now positively lock the connector 10 in its desired position within the hole 58 of the board 60 and insure against accidental dislodgment of the connector 10 therefrom by the inadvertent application of the type of a pulling force exerted on the wire 50 as normally encountered in the environments in which the connector 10 is intended to be used. The probability that an abnormal and excessive pulling force may be exerted on the wire 50 so as to deliberately distort and destroy the members 16 does not detract from, or nullify, the acceptability of the connector 10 incorporating the members 16 which members 16 have demonstrated practical utility under normal assembling and handling conditions.

Figure 7:
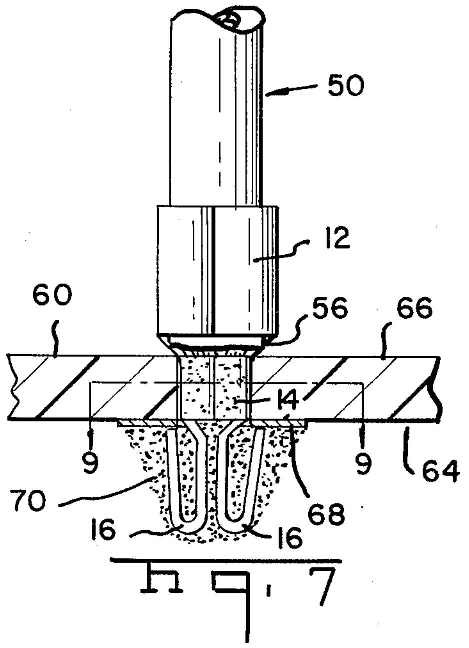
FIG. 7 is a side elevational view of the connector after the formation of the above referred to electrical solder connection.
Figure 8:
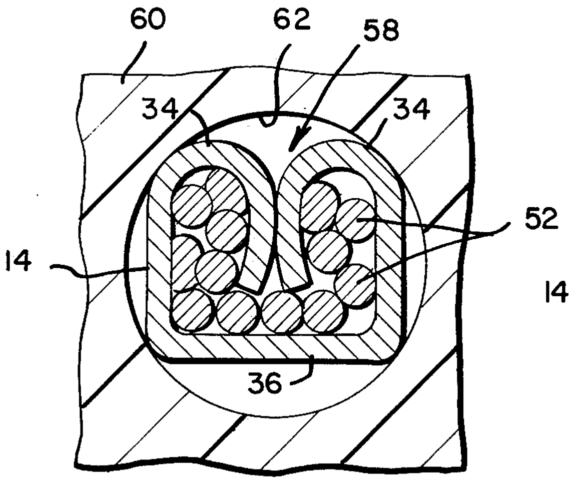
FIG. 8 is a cross-sectional view taken along line 8—8 of FIG. 6 showing the connector within the Printed circuit board hole prior to the above referred to electrical solder connection.
Figure 9:
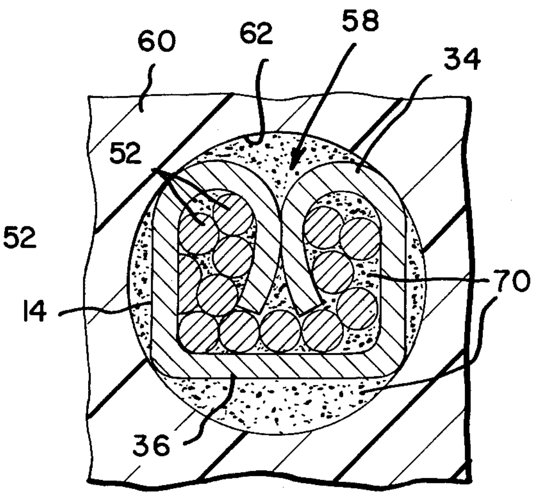
FIG. 9 is a cross-sectional view taken along line 9—9 of FIG. 7 showing the connector within the printed circuit board after the above referred to electrical solder connection.

When the connector 10 is retained in the position shown in FIGS. 6 and 7, the conductive bared end portion 52 of the wire 50 is disposed in a desired position within the sidewall 62 of te hole 58 and below the top surface 66 of the board 60. With the bared end portion 52 so disposed within the hole 58, an electrical solder connection can be readily made during a subsequent conventional soldering operation between the bared end portion 52 and a conductor 68 which is formed on the bottom surface 64 of the board 60 adjacent to the hole 58. Further, the second predetermined configuration in which the bared wire receiving portion is preferred to be formed about the conductive end portion 52, as shown in FIGS. 8 and 9, causes the separate strands of the wire 50 to be bunched together in a manner which allows voids or empty spaces to remain between the individual strands and also between the outermost strands in the bunch and interior surface portions of the bared wire receiving portion 14 along the longitudinal dimension of the bared wire receiving portion 14. These voids or empty spaces provide approximations of capillary tubes spaced within the bared wire receiving portion 14 which allow and promote a capillary rise of solder 70 within the bared wire receiving portion 14 during the soldering operation, with a resulting solder bond on the strands of the bared end portion 52 substantially as shown in cross-section in FIG. 9. While the preferred form of the second predetermined configuration of the bared wire receiving portion 14 does not embrace the wire 50 in a pressurized crimp but merely provides voids or empty spaces therein while at the same time achieves a mechanical gripping of the strands of the bared end portion 52, a partial electrical connection is inherently provided also between the bared wire receiving portion 14 and the bared end portion 52. If one so desires, a more substantial pressurized electrical crimp connection may be provided between the bared wire receiving portion 14 and the bared end portion 52 of the wire 50 in which the portions 14, 52 are fused together. In the latter case, adequate voids or empty spaces exist between longitudinal exterior surface portions of the bared wire receiving portion 14 and longitudinal portions of the hole sidewall 62 to promote the capillary rise of solder within the hole 58 to form the electrical solder connection between the printed circuit conductor 68 and the bared sire receiving portion 14 whether or not the voids or empty spaces are present within the bared wire receiving portion 14.

Figure 13:
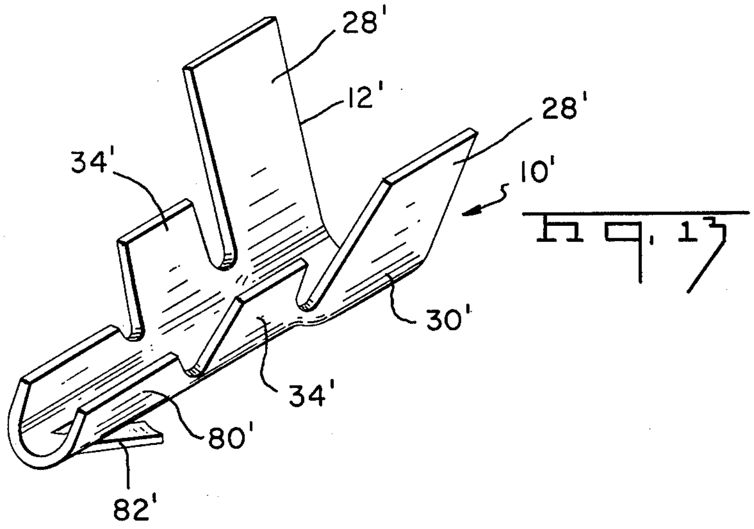
FIGS. 13–15 illustrated another embodiment of the connector shown in FIGS. 3–6.
Figure 14:
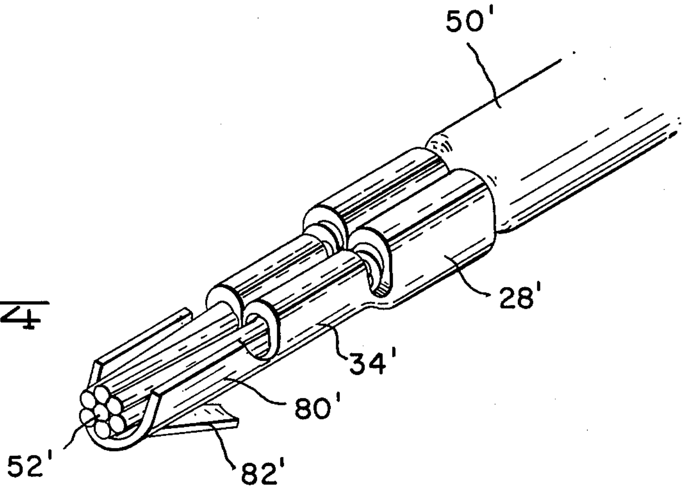
Figure 15:
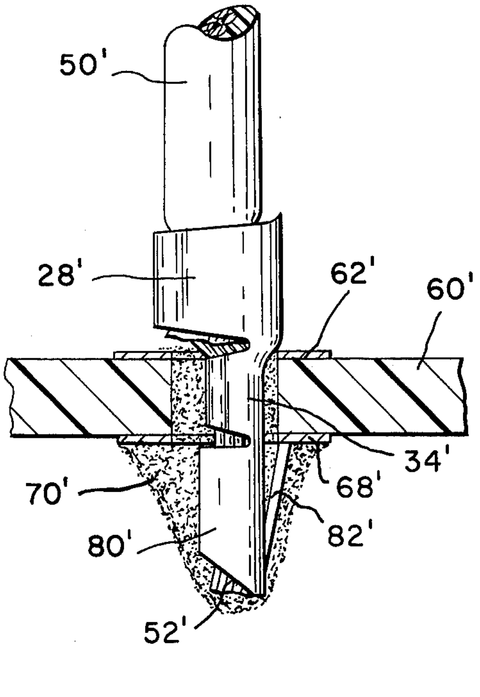

The device illustrated in FIGS. 13–15 is similar to the embodiment shown in FIGS. 3–6. It comprises a connector 10′ stamped out of flat stock to provide ferrule forming sidewalls 28′ to grip the insulation 50′ and ferrule forming sidewalls 34′ to grip the bare conductor wire 52′.

The nose portion 80′ is semi-cylindrical or channel-shaped and has a flexible lance or finger-like means 82′ stamped out of the semi-cylindrical portion 80′. The nose portion 80′ and lance 82′ are the equivalent of the hook-like members in the previous embodiment.

When it is desired to secure a conductor 52′ to the embodiment shown in FIGS. 13–15, a sufficient length of the insulation 50′ is stripped from the conductor wire 52 to permit the bare conductor to nest in the ferrule forming sidewalls 34′ and the semi-cylindrical portion 80′ (FIG. 14). The connector is crimped onto the conductor 52 by deforming the ferrule forming sidewalls 34′ and onto the insulation 50′ by deforming sidewalls 28′.

As shown in FIG. 15, the connector and wire are inserted into the opening in a printed circuit board 60′. The lance or finger-like element 82′ is retracted when the connector is inserted into the board. After passing through the board, the lance again returns to its extended position whereby it contacts printed circuit path 68′ on the under side of the board as well as securing the connector in place. The ferrule forming portion 30′ contacts the printed circuit path 62′ on the opposite side of the board. Solder 70′ may be applied to the under side of the board, e.g. by flow soldering. The solder locks the connector and wire in place by forming a bead 70′ as well as wicking up through the conductor 52′ by capillary action.

It is thought that the invention and many of its attendant advantages will be understood from the foregoing description and it will be apparent that various changes may be made in the form, construction and arrangement of the electrical connector described without departing from the spirit and scope of the invention or sacrificing all of its material advantages, the form hereinafter described being merely a preferred embodiment thereof.

What is claimed is:

1. In combination, a wire, a substrate having first and second surfaces connected by an opening therethrough and a metal contact for securing said wire to said opening and comprising:

a ferrule portion crimpable around said wire;

a crimped second portion constructed to securely hold a portion of said wire therein and further inserted within said substrate opening in a direction extending from a first surface of said substrate to the second surface of said substrate;

a channel-shaped portion having a concave portion and attached to said second portion and extending beyond said second surface of said substrate and constructed to retain the end of said wire in the concave portion thereof;

said channel-shaped portion comprising resilient finger-like means formed as a part thereof and having at least one free end extending back towards the said crimped second portion of said metal contact;

said ferrule portion constructed to contact said first surface of said substrate when said crimped second portion is inserted into said substrate opening and said channel-shaped portion constructed to have the said at least one free end of said finger-like means abut against said second surface of said substrate when said crimped second portion is inserted into said substrate opening.

2. A metal contact as in claim 1 in which:

the said at least one free end of said resilient prong means extends away from the convex side of said channel-shaped portion with the said free end thereof extending back towards and abutting against said second surface of said circuit board;

in which said wire comprises a metal conductor and an insulative sleeve enclosing said metal conductor;

in which said ferrule portion of said metal contact comprises a first ferrule crimpable around said insulative sleeve and a second ferrule crimpable around said metal conductor and positioned within said circuit board opening between said first ferrule and said second channel-shaped portion; and in which said first ferrule makes contact with the said first surface of said circuit board.

3. In combination:

a wire;

a circuit board having first and second major surfaces connected together by an opening therethrough and a conductive area thereon adjacent said opening; and a metal contact for securing said wire to said circuit board in preparation for soldering said wire to said conductive area;

said metal contact comprising:

a first ferrule means crimped around said wire, a portion of which is retained within said opening;

a second portion attached to said first ferrule means in a position extending away from said first major surface of said circuit board and constructed to loosely retain the end of said wire;

said second portion comprising resilient prong means formed as an internal part thereof and having at least one free end extending back towards the said first major surface of said circuit board;

said first ferrule means constructed to contact said second major surface of said circuit board and said second portion constructed to have the said at least one free end of said resilient prong means abut against and contact said first major surface of said circuit board.

4. An assembly as in claim 3 in which:

said resilient prong means is stamped out of said second portion;

in which said wire comprises a metal conductor and an insulative sleeve enclosing said metal conductor; and in which said metal contact further comprises a second ferrule means attached to said first ferrule means in a position extending away from said second major surface and crimped around said insulative sleeve;

said second ferrule means comprising a shoulder means which makes contact with said second surface of said circuit board.

5. The assembly of a circuit board and a metal contact for securing a wire to said circuit board by soldering and in which:

said circuit board has first and second surfaces connected by an opening therethrough; and in which said metal contact comprises:

a wire gripping means comprising a first ferrule means positioned within said opening;

a channel-shaped first portion attached to said wire gripping means and inserted completely through said circuit board opening and retaining the end of said wire therein;

said channel-shaped first portion comprising resilient prong means having first end means attached to said channel-shaped first portion and having second end means extending back freely towards the said wire gripping means of said metal contact and outwardly of the perimeter of the circuit board opening;

said wire gripping means further comprising a second portion constructed to contact a first surface of said circuit board, and said channel-shaped first portion constructed to have the said second end means of said prong means abut against the second surface of said circuit board.

6. An assembly as in claim 5 in which:

said resilient prong means comprises an integral part of said channel-shaped first portion;

in which said wire comprises a metal conductor and an insulative sleeve enclosing said metal conductor;

in which said second portion of said wire gripping means comprises second ferrule means gripping said insulative sleeve; and in which said first ferrule means is crimped around said metal conductor and positioned between said second ferrule means and said channel-shaped first portion.

7. An assembly as in claim 5 in which:

said resilient prong means comprises an integral part of said channel-shaped first portion;

in which said wire comprises a metal conductor and an insulative sleeve enclosing said metal conductor;

in which said second portion of said wire gripping means comprises second ferrule means crimped around said insulative sleeve and with said first ferrule means positioned between said second ferrule means and said channel-shaped first portion; and in which said second ferrule means makes contact with the said first surface of said circuit board.

* * * * *